Figure 1:
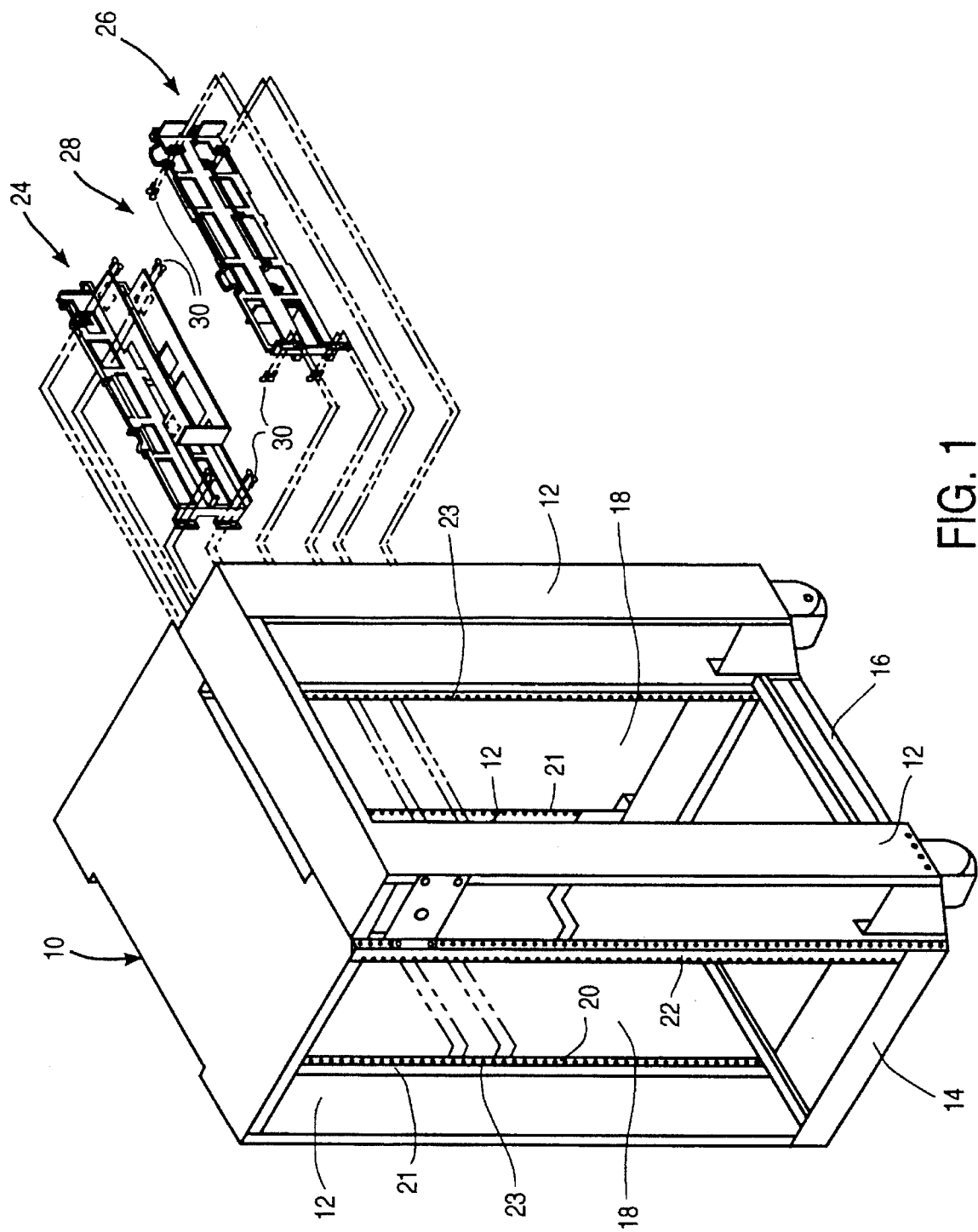

United States Patent [19]
Zandbergen

[11] Patent Number: 5,546,277
[45] Date of Patent: Aug. 13, 1996

[54] COMPUTER COMPONENT TORSIONAL LATCHING MECHANISM AND METHOD

[75] Inventor: Russ E. Zandbergen, San Jose, Calif.

[73] Assignee: Sun Microsystems, Inc., Mountain View, Calif.

[21] Appl. No.: 248,023

[22] Filed: May 24, 1994

[51] Int. Cl.⁶ .............................. H05K 7/12; E05C 3/04
[52] U.S. Cl. ..................... 361/726; 361/727; 211/26; 403/321; 312/333; 292/202
[58] Field of Search .................... 211/8, 26; 292/202; 403/321, 322; 267/165, 182; 312/216, 222, 333; 361/608, 609, 685, 725–727, 732, 740, 747, 759, 801, 825; 70/77, 78, 85

[56] References Cited

U.S. PATENT DOCUMENTS

| | | | |
|---|---|---|---|
| 2,967,080 | 1/1961 | Nelson | 70/85 X |
| 3,572,780 | 3/1971 | Levin | 403/322 X |
| 3,863,767 | 2/1975 | Garwood | 211/8 X |
| 4,246,769 | 1/1981 | McLaughlin | 70/85 |
| 4,524,872 | 6/1985 | Chamberlain | 211/8 X |
| 4,979,909 | 12/1990 | Andrews | 211/26 X |
| 4,988,008 | 1/1991 | Blum et al. | 211/26 X |
| 5,385,039 | 1/1995 | Feldpausch et al. | 70/78 |

*Primary Examiner*—Michael W. Phillips
*Attorney, Agent, or Firm*—Matthew C. Rainey

[57] ABSTRACT

The disclosure relates to a latching mechanism for securing an enclosure case of a computer system to a rack. The rack has two pairs of spaced apart posts, each having attachment locations for supporting two cooperative oppositely facing bracket members. The bracket members include platforms for supporting the bottom of the case, such as a case for a CPU. Each member has supports for rotatably receiving a torsion shaft of a latch. Each shaft is formed with two spaced apart arms having outer portions that engage the upper corners of the opposite sides of the case at two locations on each side. The arms of each shaft are angularly displaced relative to each other along the shaft so that one arm is caused to engage the case before the other arm, and in effecting the holding contact of the arms a torque is placed on the shaft, which remains as a positive force latching the case to the bracket and hence to the rack.

20 Claims, 3 Drawing Sheets

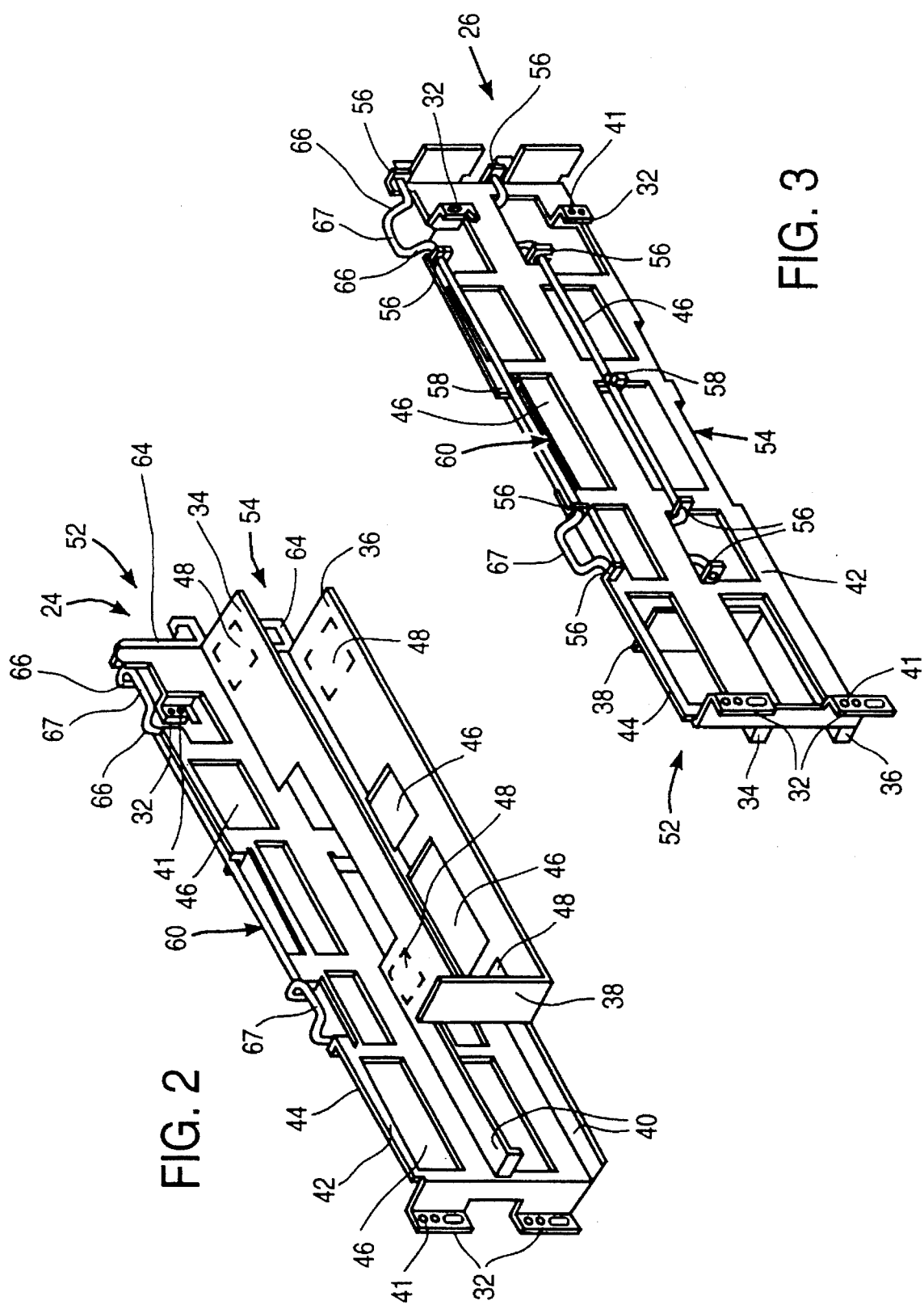

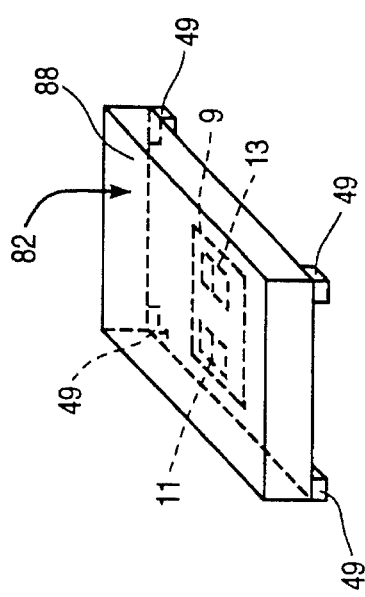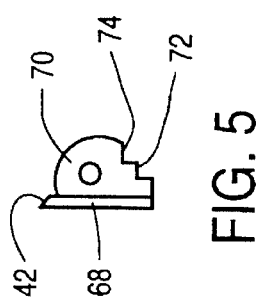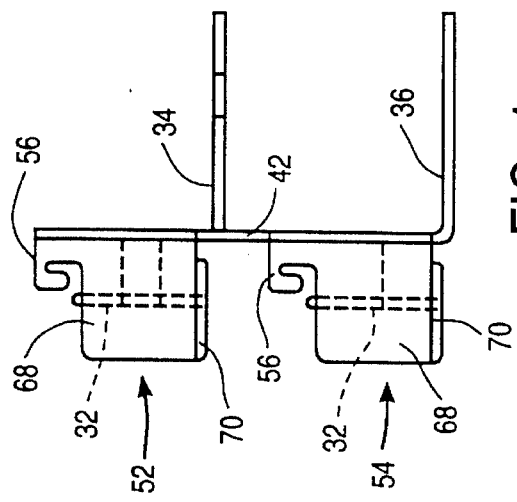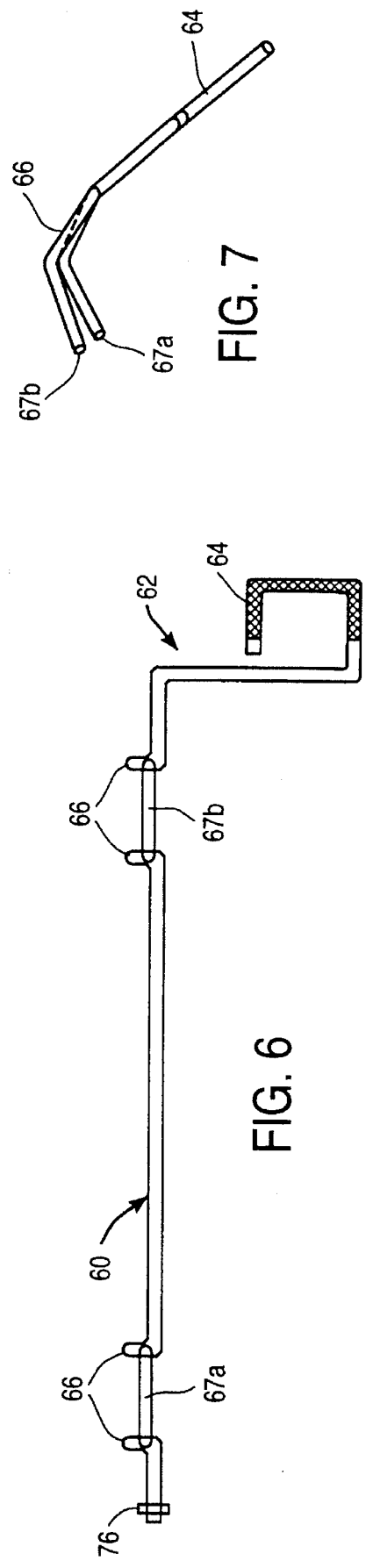

COMPUTER COMPONENT TORSIONAL LATCHING MECHANISM AND METHOD

BACKGROUND OF INVENTION

The present invention relates to an improved computing system, more particularly to both certain individual elements and the combination of a rack designed to receive a bracket, which supports an enclosure case containing some part of the system, for example, a multi-processing unit and peripherals, the case being secured to the bracket and hence the rack by a latching mechanism.

Present designs employ a variety of free standing frames, referred to commonly as racks, to house various components of the computing systems, for example, enclosure cases that contain system boards, disk drives, tape and CD-ROM units, etc. These and other elements of such computer systems contained in cases are employed in certain instances as servers, and while servers are used both in PC and work station environments, for the purpose of describing the present invention and not as a limitation, a work station environment is the intended use.

In the designs referenced to above, the cases containing the elements are mounted in the rack by fasteners, such as bolts and screws, which of course involve the use of tools, manpower and a certain amount of down time when installing, removing and replacing the cases. The fastening in the first instance is usually done by the computer manufacturer prior to shipping the system to the customer-user, in which it is important that the method of fastening maintain the internal cases secure during the usually severe pre-shipment drop and vibration testing and during shipment against vibration and inadvertent dropping. Upon receipt, the user is left with the task of removing the bolts or other fasteners to remove a case from the rack to perform needed upgrading or repairs of components and/or to replace failed components.

BRIEF DESCRIPTION OF THE INVENTION

The present invention provides a latching mechanism adapted in an ergonomic manner to be mounted on a frame element of a computer system, the mechanism including a moveable arm for latching and unlatching a component of the computer system to the frame element without the need of the use of tools.

The present invention provides an improved combination of elements of a computing system and certain individual elements of the combination and a method of manufacture and assembling of these elements, comprising a rack having attachment portions to which is secured a bracket, the bracket includes portions for supporting a latching mechanism, the bracket also includes a supporting portion for an enclosure case of an element of the system, the latching mechanism having an arm arranged to engage the case in a latching relationship on movement of the mechanism.

A further feature of the invention is to construct the latching mechanism with at least two arms arranged on a torsion shaft and in a spaced apart relationship to each other, the arms being angularly arranged on the shaft so that on rotation of the shaft one of the arms is caused to first engage the case after which the second arm makes contact, in which between the two contacts the shaft is placed under a desired torsion force that holds the arms in their latching position by a positive latching force. According to the invention, provisions are provided to allow the torsion shaft to be quickly and easily installed and removed to and from the bracket.

When employed in combination with a rack and a number of brackets, a latching mechanism for each bracket can be employed to mount several cases of various sizes in the rack. In securing the cases, the latching force is applied at spaced locations in a manner so as to be taken only in the portions of a case directly across from the feet of the case into the feet and not by other portions of the body of the case.

The above features are accomplished in a manner, when used with a rack, to allow, in a user friendly manner, for the quick, effortless and toolless latching and unlatching of the case to and from the rack, in which the latching mechanism will not take up space in the rack nor require any modification of existing designs of the case or rack, or impede the cooling of the computing components. While not requiring the use of tools to effect the latching and unlatching, the latching mechanism is capable of withstanding the usually severe pre-shipment drop and vibration testing and such forces that may be reasonably anticipated during shipment and installing.

DETAIL DESCRIPTION OF THE DRAWINGS

FIG. 1 is a schematic isometric view of a rack illustrating, in exploded fashion, a cooperative pair of left and right hand bracket members and by dot-dash line representation their operative mounted positions in the rack, FIG. 2 is an enlarged isometric view of the left hand bracket member shown in FIG. 1, FIG. 3 is an enlarged isometric view of the right hand bracket member shown in FIG. 1, FIG. 4 is an enlarged end view of the handle side i.e. the right side of the bracket member shown in FIG. 3, with the torsion shafts removed, FIG. 5 is an enlarged plan view of one of the details shown in the previous figures, FIG. 6 is an enlarged elevational view of one of the torsion shafts shown in the previous figures, FIG. 7 is an end view of the torsion shaft shown in FIG. 6, and FIG. 8 is a schematic isometric view of an enclosure case illustrating the four feet of the case and some of its components.

DETAIL DESCRIPTION OF THE INVENTION

With reference to FIG. 1 there is illustrated a rack 10, referred to sometimes hereinafter as a restraining member, of a well known design having in the usual fashion four upright free standing posts 12, this particular rack being rectangular in its plan view, thus having two short sides and two long sides, 14 and 16, respectively. The posts, along with cross members of the rack, are made of relatively heavy sheet steel commonly used in the computer industry for this purpose. The spaced apart posts 12 create an open interior 18 into which a number of enclosure cases, not shown, housing various computing components of a computing system are adapted to be securely mounted. One example of an arrangement of such components in a rack, in descending order from top to bottom, would be a peripherals tray, a disk unit, two CPUs, two disk units, two more CPUs followed by a fourth disk unit, the disk units being arranged to serve an adjacent CPU. Included with the CPUs in their cases will be the usual associated components, such as, printed circuit boards 9 ("PCBs") loaded with CPU chips 11 and memory units 13, shown schematically in FIG. 8.

Each post 12 is provided with vertical rows of inside and outside screw holes 20 and 22, respectively. Left and right hand holding complimentary cooperative members 24 and 26, respectively, of a case carrying bracket 28 are arranged to be secured to pairs of front and back posts 12 by means of the inside holes 20. The inner arranged holes 20 are formed on vertically extending bars 21 of the posts that have flat inside surfaces 23 spaced inwardly towards the center of the rack. The members or supports 24 and 26 are arranged co-planar and while located opposite hand, are identically constructed. The securement of the members 24 and 26 is by means of screws 30 that pass through tabs 32 (see FIG. 2), there being a set of two tabs provided at the opposite ends of the cooperative pair of bracket members, i.e. the left and right hand members 24 and 26. The arrangement and construction of the tabs 32 are more clearly shown in FIGS. 2 and 3 and will be described more in detail below. The members 24 and 26 are arranged parallel to the long sides 16 of the rack 10.

While FIG. 1, for simplicity, illustrates only one bracket 28, it will be appreciated that there will be mounted in the rack 10 several of these brackets, for example a bracket for each of the CPUs referred to above. These units may be of a desk top type and hence there may be a need or interest to quickly and conveniently insert and remove them to and from the rack.

In now referring to FIGS. 2 and 3, which better illustrates the construction of the bracket 28, reference will be first directed to FIG. 2 showing mainly the inside characteristics of the member 24 of the bracket. The member is formed of cold rolled mild carbon steel having upper and lower platforms 34 and 36, respectively, for supporting two stacked enclosure cases, not shown. At the inner end of the platform 36 there is provided a vertically extending stop member 38, the upper end of which projects above the upper platform 34 an amount sufficient to serve as a stop for a case supported by the upper platform 34, as the lower part of the member 38 will function as a stop for a case carried by the lower platform 36. The platforms 34 and 36 each have rearwardly extending portions 40 that terminate at the very end of the bracket member and serve to add support and rigidity to the member. The members 24 and 26 only support a relatively small portion of the underside of the cases at their two opposite corners, one of the cases in its entirety being shown in FIG. 8.

The outer longitudinal side of the bracket member 24 is formed with a vertical wall 42 to which the platforms 34 and 36 are made an integral part, the wall extending the full length of the member. FIG. 2 shows that the tabs 32 are arranged to project perpendicularly beyond the wall 42 and also outwardly to the left and right and parallel thereto. The tabs have some holes 41 that are closed and others that have open slots for convenience of mounting and alignment when the two members 24 and 26 that make up the bracket are secured to the posts 12 by the screws 30. The perpendicular projections allow the vertical wall 42 to be placed a desired distance away from the adjacent vertical inside surfaces of an associated post 12. The upper surface 44 of the bracket member 24 is maintained below the arms of a torsion shaft, to be described below, but the height of the member and the positions of the two platforms 34 and 36 are such that the tabs 32 align longitudinally with the arms and thus avoid using any of the inner space of the rack because of the employment of the latching mechanism.

FIG. 2 shows that both the platforms 34 and 36 and the vertical wall 42 are provided with a number of openings 46 that allow for cooling of the internal components of the case.

FIG. 2 also indicates by the four outlined areas 48 that each platform has two areas which will be contacted by the feet 49 of two cases, one foot for each case only being identified, which are supported by their respective platforms. In inserting a case into the bracket 28, the bracket's open front end and the lead in portions of the platforms allow the insertion as a simple quick operation. The two platforms of the members 34 and 36 are separated vertically a desired distance from each other to allow the installing of the two stacked cases. The same result is accomplished by the distance maintained between the upper platforms 34 and the computer component mounted above the bracket. The various sections that make up both sides of the bracket, in a customary manner, are interconnected by cold forming and tig welding.

FIG. 3 illustrates the outer side, that is, the side that faces the post 12, of the right hand cooperative member 26 of the bracket 28. In looking at the inside surface of the vertical wall 42, the inside surfaces of the projecting tabs 32 are seen along with the inside surfaces of the closed and slotted holes 41. As in the case of the inside construction of the bracket, the outside takes the form of upper and lower sections indicated at 52 and 54, respectively, designed to accommodate two stacked enclosure cases. Hereinafter these reference numbers will also be used to designate the inside sections formed by the platforms 34 and 36.

For each of the sections 52 and 54 there is provided four outwardly projecting horizontal in lined tabs 56 having open bottoms and a single outwardly projecting in lined tab 58 being arranged adjacent the front end of the bracket, i.e. to the right as one views FIG. 3. This latter tab has an open top, as distinguished from the bottom openings of the former tabs. The size of the openings of the four tabs 56 and 58 is made to accommodate the diameters of the bracket receiving portions of associated torsion shafts 60 of two latching mechanisms, sometime hereinafter referred to as a latch, 62 shown arranged in and supported by the bracket members in FIGS. 2 and 3. When a torsion shaft is mounted in its associated member it will be inserted into the openings of the tabs 56 and forced over the tab 58 into its opening locking the shaft in the member. While held against vertical movement, the clearance between the shaft and openings of the tabs allows for free rotation of the shaft. The provision of the tabs 56 and 58 allow the shafts to be installed and removed very quickly and easily without the use of tools.

In referring to the torsion shafts 60, it should be noted that handles 64 provided for each shaft are vertically disposed, indicating that the shafts are in their unlatched positions. In the unlatched positions the handles allow free movements of the cases into and out of each section 52 and 54 of the opposed cooperative bracket members 24 and 26. FIGS. 2 and 3 reveal that each shaft is formed with two pairs of spaced apart arms 66 having cross members 67 or latching portions, in which in referring to the upper section 52, the case, not shown, slides under the overhanging inwardly projecting cross members of the arms when the handle 64 is in the indicated vertical position. FIG. 3 shows the cooling openings 46 in the vertical wall 42.

The arms 66 of the torsion shafts 60 are located on the shafts so as to be generally directly across from where the feet of the cases are supported by the platforms 34 and 36. This design allows the latching force of an arm to be taken directly from the top of a case into its foot located directly below the point of the application of the force and hence into the associated platform, and in this way isolates the latching force from the rest of the plastic wall of the case.

To complete the description of the members 24 and 26 of the bracket 28, reference is made to FIGS. 4 and 5. At this end of the bracket on the outside thereof, there is provided for each section 52 and 54 relatively large rectangularly shaped flat tabs or containing members 68 projecting perpendicularly from the vertical wall 42 towards the post 12 of the rack 10 but spaced therefrom. These tabs 68 fall behind the handles 64 of the torsion shafts 60. The handles of each member 24 and 26 move towards the adjacent inside surface of an associated post 12, in which the bars 21 and tabs 32 space the handles far enough away from the posts sufficient to allow the necessary movements of the handles to effect the latching.

To each outside vertical face of the tabs 68 there is attached a horizontally extending detail 70 having two stepped or indented portions 72 and 74, the depths of the steps being dimensioned to receive in a locking manner a portion of the handle 64 of an associated torsion shaft 60. The details 70 are shown to have wider portions on the side nearest an associated handle when in its vertical position, which portion causes the handle to spring outwardly when moved into the latching position, after which the handle will spring back into one of the step portions 72 and 74.

The handles move from generally vertical positions, to positions approaching horizontal positions, the latter positions being the latching positions, in which the cross members 67 are caused to contact the top adjacent corner of the case. The two step portions 72 and 74 serve to lock an associated torsion shaft in its latching position and allow for the selection of two latching forces, depending on which step in which the handle is located.

Since the details 70 for each member 24 and 26 are identically constructed and arranged in the same locations, the gripping action on each side of a case can be made with substantially the same force or if desired with a different force. In any event, as between two cooperative cross members 67 of any one torsion shaft 60, once the second cross member establishes its latching force with the case the force exerted by each cross member will be substantially equal.

FIG. 6 shows that the inner end of each shaft of the latching mechanism 62 is provided with a thrust washer 76, the inner surface of which engages the adjacent outer surface of the adjacent tab 56, which contact limits the axial movement of the shaft in a direction from left to right, but yet still allows free and easy rotation of the shaft. The shaft is limited in its movement in the opposite direction by the handle 64 contacting the tab 68. To allow for a free rotation of the torsion shaft a clearance is provided between the washer 76 and tab 56 and the handle 64 and tab 68. The handles are formed in the shape of open rectangles for ease of manipulation by hand.

FIGS. 6 and 7 best illustrate the radial offset relationship of the pairs of spaced arms 66 and cross members 67 of each torsion shaft 60. The shaft shown in these figures is for the member 24, which means the shaft and cross members rotate towards one viewing FIG. 6 from the unlatched illustrated position to the latched position. The cross members are offset with respect to their radii relative to the shaft 60 as indicated in FIG. 7, where the cross member 67B, closest to the handle 64, is shown to be slightly offset with respect to the cross member 67A. In this arrangement, the cross members 67A of each shaft contact the case first after which the case is contacted by the cross members 67B. The degree of offset in the form shown, measured by the two different angles of the cross members, and further defined by the acute angle formed by two lines drawn through the parallel axes of the cross members and the parallel axis of the shaft, amounts to approximately eleven degrees, which may range between plus or minus 3 degrees in the shaft being illustrated. The reference to the acute angle is understood to mean the angle formed when the two lines are viewed as being in a common vertical plane passing transversely through the longitudinal axis of the torsion shaft 60.

FIG. 7 indicates the shape of the arms of one of the shafts that allows the cross members arranged at their outer ends to apply the latching force to one of the upper corners of the case. On rotation of the handle of the member 24 in a counterclockwise direction, i.e. into the paper so to speak, the cross member 67A is caused to contact the case first, after which on a slight additional counterclockwise rotation the cross member 67B is brought into engagement with the top surface of the case. During the time between when the two contacts are being made a desired and predetermined torque is placed on the torsion shaft sufficient to accomplish an effective constant latching force securing the case to the rack 10.

In order to accomplish the desired torsion condition, the torsion shaft 60 is made out of high carbon or alloy spring steel tempered wire. For the illustrated embodiment an approximation of the diameter of the shaft is 4.76 mm, the length of the shaft 420 mm, the throw of the arms 32 mm, and the length of the handle 93 mm. The approximate weight of the case can be 12.7 kg. The length of the handles of each member 24 and 26 will allow their lower ends to engage the details 70 of the bracket 28. The latching surfaces of the cross members 67 are coated with a plastic to improve their gripping affect with the case. The same coating, for the same reason, may be provided for the handles.

FIG. 8 is designed to indicate that an enclosure case 82 is provided with four perimetric located raised feet 49 which engage the spaced areas 48 of the platforms 34 and 36 and play a role in transferring to the platforms the latching force and in so doing protecting the plastic case from damage from this force. As indicated, the outer shell of the case is formed out of a plastic of the type customarily used in the computer industry. The case 82, being a desk top type, is provided with the four feet 49 at the four corners of the case, the feet also being formed of plastic in the general form of either a single elongated piece or two such pieces arranged perpendicularly and joined together. The portions of the feet that contact the platforms are made out of rubber like insert members. An example of the size of the length of a section of a foot for a case measuring approximately 40 cm square would be 3 cm. While the bracket has been shown to support a case in a horizontal position, the bracket may be positioned to support a case in a vertical position.

In briefly describing the operation of the latching mechanism, assuming that one or more of the brackets 28 are secured by screws 30 to the posts 12 of the rack 10, and the two torsion shafts 60 for an enclosure case 82 to be received by the rack are mounted in a toolless fashion in an associated bracket 28 with the handles 64 in their receiving positions, the case 82 can be slid over the particular cooperative pairs of platforms 34 and 36 to be used to support the case in the rack 10. In referring to the installation of only a single case, with the torsion shafts 60 in their receiving positions, the upper surface 88 of the case 82 will move free of any contact by the arms 66 and cross members 67 of the torsion shafts 60 which will be in their ambushed positions. The stop members 38 of the bracket 28 will properly position the case longitudinally on the platforms being used.

After this, to effectively latch the case 82 to the rack 10 without the need of any tools, the handles 64 of the torsion shafts 60 of a bracket 28 are rotated to cause the cross members 67 to move inwardly and particularly downwardly towards the center of the rack, where they will contact the two opposite upper corners of the case 82 and latch the case to the rack under the torsion forces created in the two shafts by the sequential latching contact of the cross members 67A and 67B of each shaft. Once this occurs, the handles will be positioned in one of the steps 72 or 74 of an associated detail 70 of the bracket 28 to assure that the torsion force on each torsion shaft will be maintained as long as the handles remain locked. This locked condition will withstand the usually severe pre-shipment drop and vibration testing and similar forces that may reasonably be expected during shipment and use. In removing the enclosure case 82 from the rack 10, the described action is simply reversed.

In a given rack a number and if desired all of the enclosure cases can be installed in the rack by employing the latching mechanism. It will be appreciated by those skilled in the art that the torsion shaft can take different forms, for example, when employed with very small size cases, a single cross member need only be used, in larger cases three or more cross members may be desirable. Also, instead of the disclosed bracket other forms may be employed. The torsion shaft may be used without a rack or bracket, in which, for example, the shaft may be mounted directly on the chassis of a case for internally securing a computer component to the chassis.

In accordance with the provisions of the patent statutes, I have explained my invention in terms of its preferred embodiment, however, it will be readily understood by those skilled in the art to which the invention pertains that it may be practiced otherwise than illustrated and described.

I claim:

1. A latching mechanism for latching a computer component to a restraining member, comprising:

a torsion shaft member rotatably mounted on a support, said support receivable by said restraining member, an arm comprising a first part of said shaft member, said arm including a portion constructed to function as a latching member, a second part of said shaft member including an element for rotating said shaft member to bring said portion of said arm into and out of a latching position, and a third part of said shaft member including a second element for creating a latching force on said portion when in said latching position.

2. A latching mechanism for latching a computer component to a restraining member, comprising:

a torsion shaft member rotatably mounted on a support, said support receivable by said restraining member, said shaft member having a longitudinal axis and including at least two arms, said arms each including a portion constructed to function as a latching member, each said arm portion including a said latching member arranged parallel to said longitudinal axis, said arms being spaced apart along said longitudinal axis of said shaft member and arranged to have a different angular relationship to each other relative to said axis, and said shaft member including an element for rotating said shaft member to bring said portions of said arms into and out of a latching position.

3. A latching mechanism according to claim 2, wherein said different angular relationship falls within the range of 8 to 14 degrees as measured by an acute angle defined by lines drawn through said longitudinal axis of said shaft member and the longitudinal axes of said latching members of said arms.

4. A latching mechanism according to claim 2, wherein said shaft member is formed out of a tempered spring steel and constructed and arranged to be capable of functioning as a torsion bar when subjected to a torque created by said portions of said arms during the latching operation.

5. A combination of a holding member, a securable unit of a computer system and a latch comprising:

said holding member including a portion constructed and arranged to receive said latch in a manner that permits movement thereof, said latch including a latching portion constructed and arranged to latch said securable unit to said holding member, and said latch including a torsion member for effecting movement of said latching portion to and from a latching position with said securable unit and for creating a latching force on said latching portion when in said latching position.

6. A combination according to claim 5, wherein said combination includes a frame and said holding member comprises a bracket, said frame including an attachment portion, said bracket including a first portion securable to said attachment portion of said frame, said bracket including a second portion for receiving said latch, said latching portion constructed and arranged to latch said unit to said bracket, said latch including a second portion for effecting movement of said latching portion to and from the latching position with said unit, and said latching portion and said portion for effecting said movement being an integral part of said torsion member.

7. A combination according to claim 6, wherein said torsion member includes separate portions comprising said latching portion, said portion for effecting movement and a portion received by said bracket, and said torsion member, said bracket and their relationship to each other being such that said latching portion of said latch is maintained in said latching position under a predetermined latching force.

8. A combination according to claim 6, including a containing member including a portion engagable by said portion for effecting movement in a manner to maintain said latching portion in said latching position under a predetermined latching force, said securable unit comprising an enclosure case having an internally installed PCB, CPU and memory units, and wherein said bracket includes openings sized to allow circulation of air adjacent said unit.

9. A combination of a rack, a bracket, a latch, and a component of a computer system, comprising:

said rack including spaced apart uprights each including attachment portions, said bracket including spaced apart attachment portions constructed and arranged to be attached to a different one of said attachment portions of said uprights, fastening facilities for effecting said attachment of said bracket and uprights, said bracket including a computer component carrying portion for supporting said component, said bracket including a latch supporting portion, said latch comprising a shaft including a bracket receiving portion, an arm and a handle each having a spaced relationship to each other on said shaft, said bracket receiving portion of said shaft being constructed and arranged to be received by said latch supporting portion of said bracket, said component including an outer engagable surface which when said component is supported by said carrying portion of said bracket said surface is presented in a position to be engaged by said arm, said arm including a latching portion constructed and arranged to engage said outer surface of said supported component to latch said component to said bracket and hence to said rack, said latch including an element for creating a latching force on said latching portion when engaged with said outer surface, and said handle being constructed and arranged to be moveable while supported by said bracket so as to bring said latching portion of said arm into and out of a latching position with said component.

10. A combination according to claim 9, wherein said shaft is supported by said bracket in a manner to allow rotation of said shaft, said shaft comprising a torsion shaft, said component comprising a case having an internally installed PCB, CPU and memory units, and a containing member including a portion engagable by said handle in a manner to maintain said latching portion of said arm in said latching position under a predetermined latching force.

11. A combination according to claim 10, wherein said arm comprises a first arm and said latch includes a second arm arranged in a spaced apart relationship to said first arm on said torsion shaft, said arms each including similar portions constructed to extend towards different portions of said component when carried by said bracket and terminating into a said latching portion arranged between said extending portions, each said latching portions comprising a cross member, and said cross members of each of said arm being constructed and arranged to assume a different angular relationship to each other relative to the longitudinal axis of said torsion shaft, such that on rotation of said latch one of said cross members is caused to engage one of said portions of said component before said other cross member is caused to engage the other of said portions of said component, and wherein once said one cross member is caused to make its engagement said torsion shaft is subject to a torsion force until said other cross member is caused to make its engagement, and wherein after said last said engagement said torsion shaft continues to be subjected to a torsion force.

12. A combination according to claim 11, wherein said rack includes two cooperative pairs of said uprights, each including a said attachment portion of said uprights, said bracket includes two complimentary cooperative members, a said spaced apart attachment portion of said bracket for each of said members, said attachment portions of each said bracket member being attached to a different one of said attachment portions of said pairs of said uprights, such that said bracket members are attached to a different one of said pairs and arranged directly across from each other, each said bracket member including a said latch, each said bracket member including a wall member, said carrying portion of each said bracket member including a first platform carried by each said wall member in a manner to be generally co-planar and parallel to each other, said platforms including supporting surfaces of a dimension sufficient to support portions of the opposite sides of said component, and said bracket members including common ends constructed and arranged to receive said component.

13. A combination according to claim 12, wherein said component comprises a first said component, each said bracket member having a second said platform spaced from said first said platform of said members, in a manner that said two members support a second said component in a stacked superimposed relationship with said first component, said second platforms including supporting surfaces of a dimension sufficient to support portions of the opposite sides of said second component, and said common ends of each of said bracket members being constructed and arranged to receive said second component.

14. A combination according to claim 13, wherein each said bracket member includes a stop element for positioning their said supported components on associated said platforms, each said bracket member includes a said latch supporting portion including spaced apart generally aligned tabs, each said tab includes a portion constructed and arranged to receive and rotatably support a different portion of an associated torsion shaft, and said torsion shafts being formed out of a tempered spring steel.

15. A method of manufacturing a mounting arrangement for a unit of a computing system, said arrangement including a frame, a bracket and a latch, said unit having first and second outer engagable surfaces, the steps comprising:

forming on said frame supporting surfaces, forming said bracket to include two side members, forming each said side member to include a supporting surface constructed and arranged to cooperate with a different one of said supporting surfaces of said frame in a manner to secure said side members to said frame, in which said side members are co-planar and parallel to each other, forming each said side member to include supporting portions constructed and arranged to support a different portion of said first outer surface of said unit, forming on each said side member a latch receiving portion, forming a said latch for each said side member from a metal shaft, including forming in a spaced relationship to each other as part of each said shaft an arm, a bracket receiving portion and a handle, forming each said bracket receiving portion of an associated latch to be received by said latch receiving portion of an associated side member, forming and arranging each said arm in a manner such that when said unit is supported by said supporting portions of said side members different portions of said second outer engagable surface of said unit are arranged adjacent to said arms, forming each said arm further to include a portion arranged to contact a different one of said different portions of said second outer .engagable surface of said unit, in a manner to latch said unit to said bracket and hence to said frame, forming said portions of said arms in a manner to create a latching force on said unit when latched to said bracket, and forming each said handle to effect a rotation of an associated arm so as to bring an associated arm into and out of contact with a different one of said different portions of said second outer engagable surface of said unit.

16. A method according to claim 15, comprising the additional steps of:

forming said frame as a rack having spaced apart posts forming an opening for receiving said unit, forming on each said post a said supporting surface, forming each said shaft as a torsion shaft, forming each said arm in the form of two spaced arms along the axis of said shaft, forming each said arm portion to include a latching member arranged parallel to said axis of an associated shaft and arranging said latching members of an associated shaft to have a different angular relationship to each other relative to an associated shaft axis, and causing each said torsion shaft to be carried by an associated bracket in a manner to maintain said arms of said latches in said latching positions under a torsion force.

17. A method according to claim 16, comprising the additional steps of:

forming each said shaft out of a tempered spring steel, forming, constructing and arranging a holding member for each shaft so as to be engaged by an associated handle so as to maintain an associated shaft in said latching position, and forming said unit as an enclosure case and installing in said case a PCB, CPU and memory units.

18. A method of assembling a computer arrangement comprising at least two cases, each case adapted to contain computer components, said arrangement also including a rack, a bracket facility, and a shaft having a latching portion, the steps comprising:

dividing said rack into areas suitable for receiving a different one of said cases in a superimposed relationship to each other, mounting in a least one of said areas a said bracket facility in a manner to support at least one of the sides of one of said cases, securing to said bracket facility said shaft in a manner to bring said latching portions into a latch position, latching said one case to said bracket facility and hence to said rack, and subjecting said shaft to a torsion force when in said latching position to maintain said latching portion in said latch position.

19. A method according to claim 18, comprising the additional steps of:

securing said shaft without the use of a tool on said bracket facility, forming said shaft to have two spaced said latching portions, and arranging said two latching portions to create said torsion force of said shaft by the sequential engagement with said one case of said two latching portions of said shaft.

20. A method according to claim 18, wherein said arrangement includes a holding member, comprising the additional step of:

when said shaft is in its latching position causing said shaft to engage said holding member in a manner to maintain said shaft in its latching position under said torsion force.

* * * * *